(12) United States Patent
Lin et al.

(10) Patent No.: US 8,124,535 B2
(45) Date of Patent: Feb. 28, 2012

(54) METHOD OF FABRICATING SOLAR CELL

(75) Inventors: Ching-Hsi Lin, Hsinchu (TW);
Chien-Rong Huang, Hsinchu (TW);
Dimitre Zahariev Dimitrov, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/658,663

(22) Filed: Feb. 11, 2010

(65) Prior Publication Data
US 2011/0143484 A1 Jun. 16, 2011

(30) Foreign Application Priority Data
Dec. 14, 2009 (TW) .............................. 98142746 A (51) Int. Cl.
H01L 21/302 (2006.01)
H01L 21/461 (2006.01)
H01L 21/3105 (2006.01)
H01L 21/00 (2006.01)
H01L 31/0216 (2006.01)
H01L 31/0236 (2006.01)

(52) U.S. Cl. ... 438/705; 438/71; 438/750; 257/E21.244; 257/E31.119; 257/E31.13

(58) Field of Classification Search ............ 438/71, 438/72, 705, 745, 749, 750, 754, 769–775, 438/778
See application file for complete search history.

(56) References Cited

U.S. PATENT DOCUMENTS

| | | | |
|---|---|---|---|
| 5,665,175 A * | 9/1997 | Safir .............................. 136/255 |
| 6,790,785 B1 | 9/2004 | Li et al. | |
| 7,135,414 B2 | 11/2006 | Matsumura et al. | |
| 2002/0017063 A1* | 2/2002 | Beitel et al. ...................... 51/307 |
| 2003/0177976 A1* | 9/2003 | Oki et al. ......................... 117/20 |
| 2005/0263219 A1* | 12/2005 | Hoeschele et al. ............ 148/512 |
| 2008/0210294 A1* | 9/2008 | Moslehi ......................... 136/251 |
| 2009/0280597 A1* | 11/2009 | Wijekoon et al. ............... 438/71 |
| 2011/0045631 A1* | 2/2011 | Ji et al. ............................ 438/98 |

FOREIGN PATENT DOCUMENTS

WO 2007025536 3/2007

OTHER PUBLICATIONS

Takashi Tsuboi et al., Chemical etching of porous silicon in diluted hydrofluoric acid, Solid State Communications 109, 1999, pp. 195-199.
P. Gorostiza et al., First stages of platinum electroless deposition on silicon (100) from hydrogen fluoride solutions studied by AFM, Thin Solid Films 275, 1996, pp. 12-17.
Dimitre Z. Dimitrov et al., Nanotextured Silicon Solar Cells Prepared by Using Standard Screen-Printing Process, 24th European Photovoltaic Solar Energy Conference, Sep. 21-25, 2009, Hamburg, Germany.
Ching-Hsi Lin et al., Non-Vacuum Processing and Properties of Black Silicon Solar Cell, 24th European Photovoltaic Solar Energy Conference, Sep. 21-25, 2009, Hamburg, Germany.
D. Dimova-Malinovska et al., Preparation of thin porous silicon layers by stain etching, Thin Solid Films 297, 1997, pp. 9-12.

* cited by examiner

*Primary Examiner* — Charles Garber
*Assistant Examiner* — Calvin Choi
(74) *Attorney, Agent, or Firm* — J.C. Patents (57) ABSTRACT

A method of fabricating a solar cell is provided. A saw damage removal process is performed on a silicon substrate. A dry surface treatment is performed to a surface of the silicon substrate on form an irregular surface. A metal-activated selective oxidation is performed to the irregular surface. By using an aqueous solution, the irregular surface is etched to form a nanotexturized surface of the silicon substrate. A dopant diffusion process is performed on the silicon substrate to form a P-N junction. An anti-reflection layer is formed on the silicon substrate. An electrode is formed on the silicon substrate.

23 Claims, 7 Drawing Sheets

METHOD OF FABRICATING SOLAR CELL

CROSS-REFERENCE TO RELATED APPLICATION

This application claims the priority benefit of Taiwan application serial no. 98142746, filed on Dec. 14, 2009. The entirety of the above-mentioned patent application is hereby incorporated by reference herein and made a part of this specification.

BACKGROUND OF THE INVENTION

1. Field of the Invention

The invention generally relates to a method of fabricating a solar cell with low reflectivity.

2. Description of Related Art

Solar cell is a very promising clean energy source, which can generate electricity directly from sunlight. However, the efficiency of solar cells needs to be further enhanced, so that solar cells can be widely accepted as a major electricity source. In general, the efficiency of solar cells is highly relevant to the light absorption mechanism and the usage of light generating carriers.

Recently, all high-efficiency single crystalline silicon solar cells have a particular textured structure on the front surface, so as to reduce the reflection losses and to improve the light-trapping property. Currently, the most effective texturization method is to etch pyramids on monocrystalline wafers with (100) surface. This method is usually performed by using alkaline etching solutions of potassium hydroxide (KOH) or sodium hydroxide (NaOH) with anisotropic etching rates, where the etching rate of (111) surface is slower than that on (100) and (110) surfaces by two orders of magnitude. Therefore, randomly distributed pyramids are formed through intersecting (111) surface, which are called random pyramids, or inverted pyramids are formed by using a cross-hatched masking layer. However, as the multiple grains of multicrystalline wafers have different orientations, the method aforementioned is not suitable for multicrystalline wafers.

On the other hand, when the conventional alkaline etching technique is used, the random grain orientations of the multicrystalline silicon wafer have an inhibited effect in forming the uniform and effective surface configuration. Therefore, the isotropic etching or other approaches that are not affected by the crystal orientation must be adopted to texturize the surface of multicrystalline silicon wafer.

As for a wet chemical isotropic etching of multicrystalline silicon, hydrofluoric acid (HF) and nitric acid ($HNO_3$) are more suitable. The reaction of these acids with silicon is strongly exothermic. Generally, the silicon substrate processed with this traditional acid etching treatment usually has higher reflectivity.

In addition, a wet chemical approach for texturing multicrystalline silicon has been disclosed in U.S. Pat. No. 6,790,785, where a nanometer scale porous layer is etched on a multicrystalline silicon surface. The weighted reflectance values obtained by this approach is reduced to 9%, but the short-circuit current density of the solar cell is significantly reduced. That's because the porous silicon etching may result in poor surface recombination loss and high absorption coefficient for short wavelength photons. Furthermore, as the direct bandgap behavior of the short wavelength response is reduced, the porous silicon layer has an appreciable absorption loss.

Furthermore, in some research, the silicon surface is textured by first disposing a metal-containing layer, for example, as disclosed in WO 2007/025536, and the etching process is performed with a solution containing hydrofluoric acid (HF) or ammonium fluoride ($NH_4F$), as well as an oxidizing agent. However, it is quite complicated to control the thickness of the metal-containing layer in terms of a large surface area.

Thus, a method for the silicon substrate to have a surface structure with low reflectivity is needed to improve the light absorption efficiency of the solar cell and enhance the performance of the solar cell.

SUMMARY OF THE INVENTION

The invention is directed to a method of fabricating a solar cell to fabricate a solar cell with low reflectivity.

The invention is directed to a method of fabricating a solar cell. A saw damage removal process is performed on a silicon substrate. A dry surface treatment is performed on a surface of the silicon substrate to form an irregular surface. A metal-activated selective oxidation is performed on the irregular surface. The irregular surface is etched by using an aqueous solution to form a nanotexturized surface of the silicon substrate. A dopant diffusion process is carried out to the silicon substrate to form a P-N junction in the silicon substrate. An anti-reflection layer is formed on the silicon substrate. An electrode is formed on the silicon substrate.

In light of the foregoing, the method of fabricating the solar cell in the invention includes performing the dry surface treatment on the silicon substrate in cooperation with the metal-activated selective oxidation and the wet etching process, such that the silicon substrate has a surface structure with low reflectivity. Here, the dry surface treatment facilitates the proceeding of the metal-activated selective oxidation and the wet etching process, thereby enhancing the fabrication efficiency of the solar cell, so that the solar cell has a nanotexturized surface. As a consequence, the solar cell has low reflectivity so as to achieve high light absorption efficiency and superior performance.

In order to make the aforementioned and other features and advantages of the invention more comprehensible, embodiments accompanying figures are described in detail below.

DESCRIPTION OF EMBODIMENTS

Figure 1:
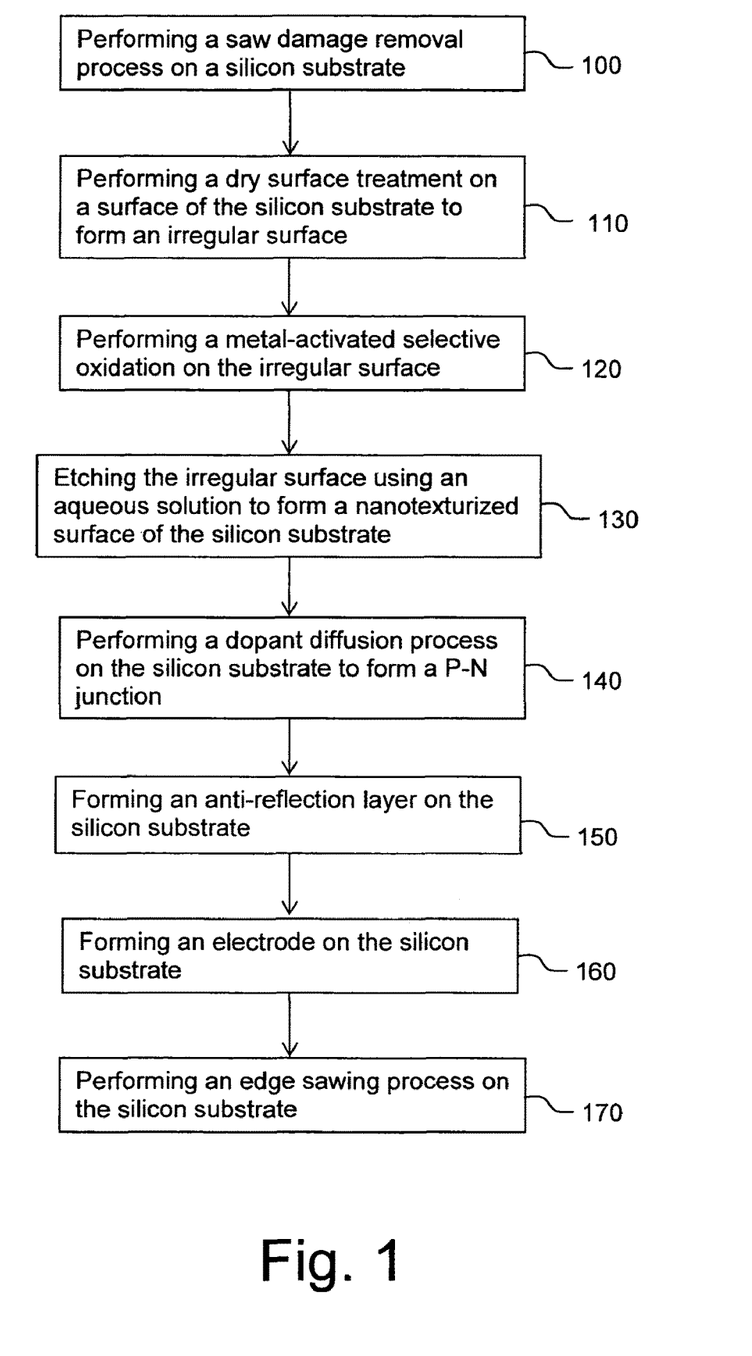
FIG. 1 is a flowchart of a method of fabricating a solar cell according to one embodiment of the invention.

FIG. 1 is a flowchart of a method of fabricating a solar cell according to one embodiment of the invention.

Referring to FIG. 1, step 100 is performed, in which a saw damage removal (SDR) process is performed on a silicon substrate. In this step, a solution containing hydrofluoric acid (HF), nitric acid ($HNO_3$), and hydrogen peroxide ($H_2O_2$), for example, is utilized to etch the silicon substrate for about 0.5-5 minute (min) at 4-25° C. In the present embodiment, a molar ratio of HF to $HNO_3$ to $H_2O_2$ in the solution is, for example, 1:10:1 to 15:1:1 (HF:$HNO_3$:$H_2O_2$). It should be noted that the foregoing method is merely one of many methods for removing saw damages. In other words, this step can be performed using other conventional methods known by person having ordinary skill in the art.

Step 110 is carried out, in which a dry surface treatment is performed on the silicon substrate to form an irregular surface. In the present embodiment, an atmospheric pressure plasma jet (APPJ) is applied to process the surface of the silicon substrate in this step. In the AAPJ surface treatment, the gas adopted includes nitrogen or clean dry air, for instance. A radio frequency (RF) power of the AAPJ treatment ranges from 250-800 Watts (W), for example. A processing rate of the AAPJ treatment ranges from 20-200 millimeter/second (mm/s), for example. In addition, take a 5-inch silicon wafer as an example, a width of a plasma beam in the AAPJ treatment ranges, for instance, from 2-4 mm; a processing time of the AAPJ treatment ranges from 20-240 second (s), for example; a distance between the plasma beam and the silicon substrate ranges from 5-30 mm, for example.

In another embodiment, the surface of the silicon substrate is performed with a laser treatment in step 110, for example. In the laser treatment, an Nd-YAG laser is adopted, for instance, where a wavelength of the YAG laser is, for example, 532 μm or 1064 μm. A laser power in the laser treatment ranges from 1-20 W, for example. A laser processing dot pitch of the laser treatment ranges from 100-1000 μm, for example, and a processing time of the laser treatment ranges, for example, from 0.1-1 millisecond (ms).

It should be noted that in step 110, by treating the surface of the silicon substrate with the dry surface treatments such as the AAPJ treatment or the laser treatment, the surface of the silicon substrate becomes a surface distributed with micro damages, so that the surface energy of the silicon substrate is enhanced. Accordingly, the metal-activated selective oxidation and the etching texturizing process can be carried out more uniformly.

Step 120 is proceeded to perform the metal-activated selective oxidation on the irregular surface formed by the dry surface treatment. In the present embodiment, the metal-activated selective oxidation is performed by using an aqueous solution containing oxidant and metal salt, for instance. The oxidant includes, for example, persulfate ion, permanganate ion, bichromate ion, or a mixture thereof. The metal salt is, for example, a water-soluble silver salt such as silver nitrate ($AgNO_3$). When the aqueous solution used in the metal-activated selective oxidation includes sodium persulfate ($Na_2S_2O_8$) and $AgNO_3$, the molar ratio of $Na_2S_2O_8$ to $AgNO_3$ is, for example, 2:1 to 150:1. Moreover, a duration time of the metal-activated selective oxidation ranges from 5-10 min, for example. After step 120, the silicon substrate may be rinsed with deionized water.

Step 130 is performed, in which the irregular surface is etched by using an aqueous solution to form a nanotexturized surface of the silicon substrate. This step is performed with the aqueous solution containing HF and $H_2O_2$, and a molar ratio of HF to $H_2O_2$ to $H_2O$ is 1:1:10 to 3:1:30 (HF:$H_2O_2$:$H_2O$). A time of etching the irregular surface ranges from 5-0 min, for instance.

After the silicon substrate having the nanotexturized surface has been formed, the silicon substrate may be rinsed with an aqueous solution containing potassium hydroxide (KOH) to remove a formed nano-porous Si layer. Here, a volume ratio of KOH and $H_2O$ is 1:50. In addition, a concentrated nitric acid ($HNO_3$) solution may be optionally used to remove undesired metal/metal salts contaminations (such as the silver remained) generated from the preceding steps.

Step 140 is carried out, where a dopant diffusion process is performed on the silicon substrate for forming a P-N junction in the silicon substrate. In this step, a phosphosilicate glass layer is formed on the silicon substrate having the nanotexturized surface, for example, and then the silicon substrate is placed into a diffusion furnace to proceed the dopant diffusion for forming the P-N junction. The phosphosilicate glass layer is removed upon the completion of the dopant diffusion. Here, the dopant includes phosphorus oxychloride ($POCl_3$) or other dopants used for forming the P-N junction. In particular, the foregoing method is merely one of many methods for carrying out dopant diffusion. In other words, this step can be performed using other conventional methods known by person having ordinary skill in the art.

Step 150 is performed to form an anti-reflection layer on the silicon substrate. In the present embodiment, the anti-reflection layer is formed on the silicon substrate having the nanotexturized surface, for instance. The anti-reflection layer is made of, for example, silicon nitride, and a method of forming the same includes a physical vapor deposition process, for example. It should be noted that the foregoing method is merely one of the many methods for forming the anti-reflection layer. In other words, this step can be performed using other conventional methods known by person having ordinary skill in the art.

Step 160 is proceeded to form an electrode on the silicon substrate. In the present embodiment, a method of forming the electrode includes a screen printing process and a sintering process. In details, a metal paste containing metal powder, glass powder, and organic carrier is screen printed on the anti-reflection layer, for example, and the sintering process is then performed to cure the anti-reflection layer so as to form an electrode. It should be noted that the foregoing method is merely one of the many methods for forming the electrode. In other words, this step can be performed using other conventional methods known by person having ordinary skill in the art.

Step 170 is carried out, in which an edge sawing process is performed on the silicon substrate to complete the fabrication of the solar cell. That is, after the element layers such as the anti-reflection layer and the electrode are formed on the silicon substrate, the element layers in the periphery of the silicon substrate are performed with an isolation process and an edge deletion process by using methods such as the laser treatment, so as to prevent the generation of current and proceed to the following packaging process. Herein, the isolation process and the edge deletion process are well known to person having ordinary skill in this art, and thus are not be described herein. Obviously, the foregoing method is merely one of the many methods for performing the edge sawing process. In other words, this step can be performed using other conventional methods known by person having ordinary skill in the art.

In the present embodiment, the solar cell formed by the foregoing process has nanotexturized surface, such that the solar cell has low reflectivity, and thereby achieves high light absorption efficiency and superior performance. Since the surface of the silicon substrate is processed with dry surface treatments such as the AAPJ treatment or the laser treatment, the metal-activated selective oxidation and the etching texturizing process can be carried out more uniformly to enhance the fabrication efficiency of the solar cell. In short, the method of fabricating the solar cell of the invention includes steps that are simple and easily operable. Furthermore, the issue of high reflectivity of the traditional multicrystalline silicon solar cell can be improved, thereby leading to the fabrication of a highly efficient multicrystalline silicon solar cell.

Several examples are described below to prove the efficacy of the invention.

EXAMPLES 1-5

A solution of $HF:HNO_3:H_2O$ with a volume ratio of 2:7:1 is adopted to etch a silicon substrate for about 3 min at about 10° C. so as to perform an SDR. The silicon substrate is processed with an AAPJ treatment to have an irregular surface. The parameters in the AAPJ treatment are presented below:

Gas: Example 1 to Example 3 are processed with nitrogen while Example 4 and Example 5 are processed with clean dry air.

RF power: 450 W (13.56 MHz)
Processing rate: 150 mm/s
Processing time: 30 s
Width of plasma beam: 3 mm
Distance between plasma beam and silicon substrate: 1 cm.

Figure 2:
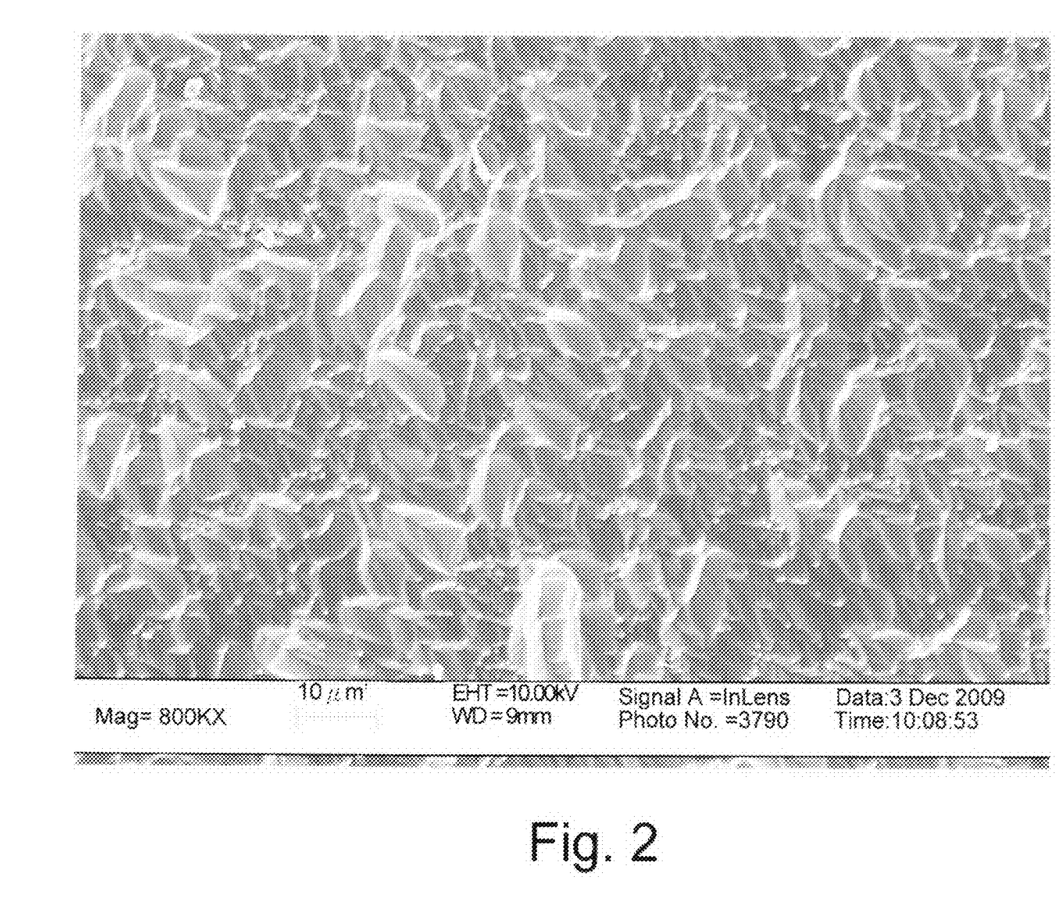
FIG. 2 is an SEM photo of a surface of a silicon substrate in Example 5 before an atmospheric pressure plasma jet (AAPJ) treatment is performed.
Figure 3:
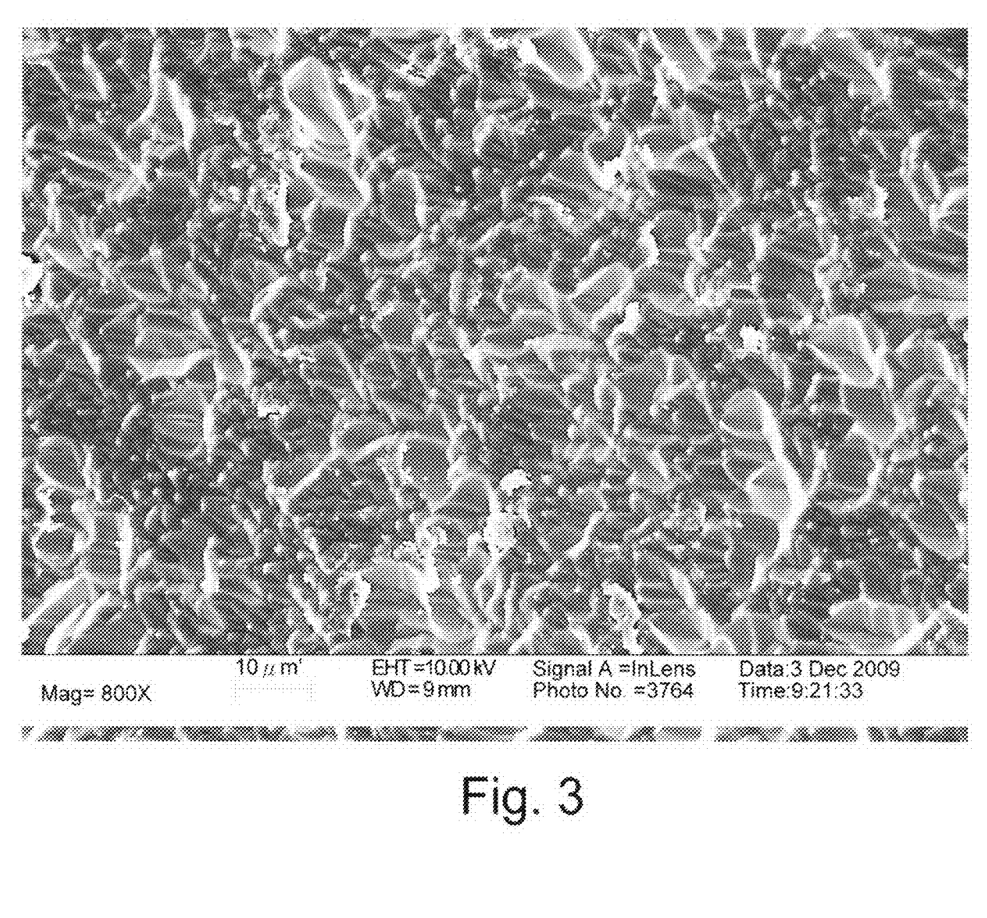
FIG. 3 is an SEM photo of the surface of the silicon substrate in Example 5 after the atmospheric pressure plasma jet treatment is performed.

FIG. 2 is an SEM photo of a surface of a silicon substrate in Example 5 before an AAPJ treatment is performed. FIG. 3 is an SEM photo of the surface of the silicon substrate in Example 5 after the AAPJ treatment is performed. By comparing FIGS. 2 and 3, it is observed that the AAPJ treatment results in damages on the surface of the silicon substrate, which facilitates the proceeding of the metal-activated selective oxidation and the wet etching process.

The silicon substrate is placed into a solution of 0.1 M $Na_2S_2O_8$ and 0.1 M $AgNO_3$ with a volume ratio of 2:1 at room temperature under mild agitation to carry out the metal-activated selective oxidation step. Here, the steps of the entire metal-activated selective oxidation are completed in about 5-10 min. The silicon substrate is then rinsed with deionized water and dried in nitrogen ($N_2$) flow.

The silicon substrate after the selective oxidation is placed into the aqueous solution containing HF and $H_2O_2$ (the volume ratio of $HF:H_2O_2:H_2O$ is 1:5:10), etched for about 5-10 min at room temperature, and then rinsed with deionized water and dried in the $N_2$ flow.

Figure 4:
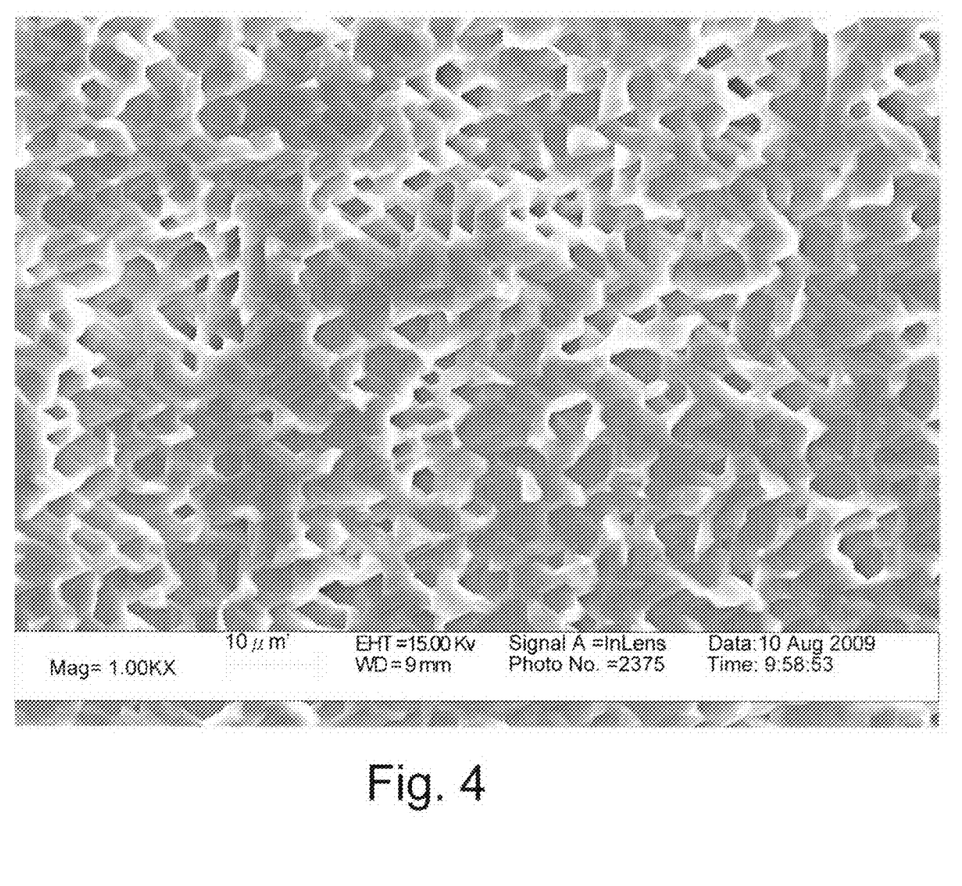
FIG. 4 is an SEM photo of the surface of the silicon substrate in Example 5 after a nano-porous silicon layer formed is removed.

The silicon substrate is dipped in a $KOH:H_2O$ solution with a volume ratio of 1:50 for removing the nano-porous Si layer formed. The concentrated $HNO_3$ solution may be optionally used to remove the remaining silver, and the silicon substrate is then rinsed with deionized water. FIG. 4 is an SEM photo of the surface of the silicon substrate in Example 5 after the nano-porous Si layer formed is removed. Processes including phosphorus diffusion, anti-reflection layer deposition, electrode formation, and so on are performed to complete the fabrication of the solar cell. The solar cell completed has an area of approximately 145 cm². Example 1 to Example 3 are solar cells that are fabricated by performing the same process repeatedly, and Example 4 to Example 5 are also solar cells fabricated by performing the same process repeatedly.

COMPARATIVE EXAMPLES 1-3

Figure 5:
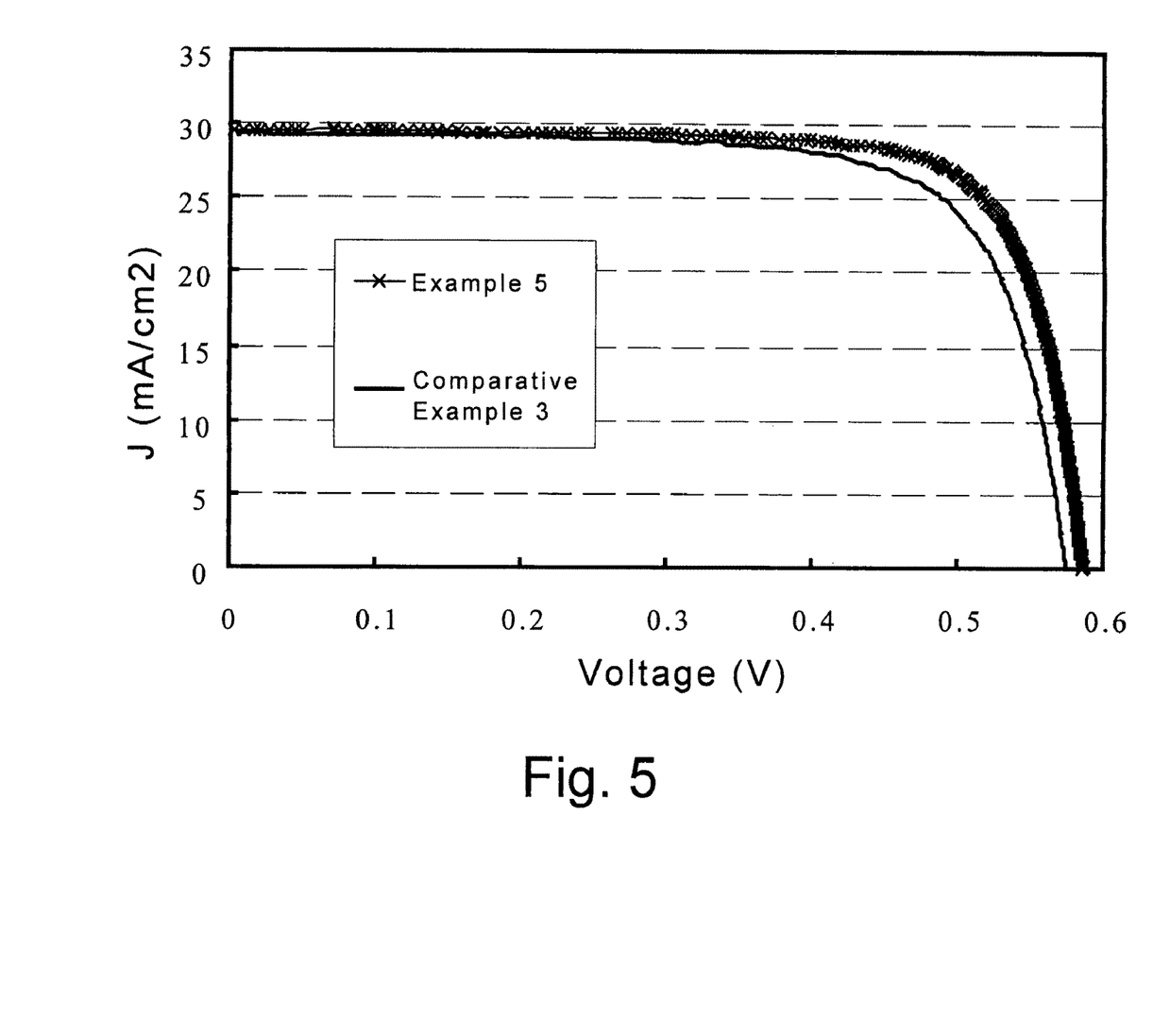
FIG. 5 is a current-voltage (I-V) graph of a solar cell in Example 5 (performed with the atmospheric pressure plasma jet surface treatment) and a solar cell in Comparative Example 3 (not performed with the atmospheric pressure plasma jet surface treatment).

In addition, the fabrication of Comparative Examples 1-3 is only different from that of the solar cells aforementioned in that surfaces of the solar cells in Comparative Examples 1-3 are not processed with the AAPJ treatment. Comparative Example 1 to Comparative Example 3 are solar cells that are fabricated by repeatedly performing the same process.
Measurement FIG. 5 is a current-voltage (I-V) diagram of the solar cell in Example 5 (performed with the AAPJ surface treatment) and the solar cell in Comparative Example 3 (not performed with the AAPJ surface treatment). Table 1 records the experimental data measured from Comparative Examples 1-3 and Examples 1-5, and calculates the conversion efficiency of the solar cells.

As shown in FIG. 5 and Table 1, the conversion efficiencies of the solar cells in Example 1 to Example 5 are significantly higher than that of the solar cells in Comparative Example 1 to Comparative Example 3. That is, the performance of the solar cells can be enhanced by performing the AAPJ treatment before carrying out the metal-activated selective oxidation and the etching texturizing process.

TABLE 1

|  | $V_{OC}$ (V) | $J_{SC}$ (mA/cm²) | F.F (%) | Efficiency (%) |
|---|---|---|---|---|
| Comparative Example 1 | 0.577 | 29.32 | 0.739 | 12.51 |
| Comparative Example 2 | 0.575 | 29.24 | 0.732 | 12.31 |
| Comparative Example 3 | 0.575 | 29.31 | 0.735 | 12.37 |
| Average value of Comparative Examples 1-3 | 0.576 | 29.29 | 0.735 | 12.4 |
| Standard deviation of Comparative Examples 1-3 | 0.001 | 0.04 | 0.004 | 0.1 |
| Example 1 | 0.588 | 29.91 | 0.777 | 13.68 |
| Example 2 | 0.581 | 29.34 | 0.765 | 13.05 |
| Example 3 | 0.582 | 28.96 | 0.768 | 12.95 |
| Average value of Examples 1-3 | 0.584 | 29.4 | 0.77 | 13.23 |
| Standard deviation of Examples 1-3 | 0.004 | 0.48 | 0.006 | 0.4 |
| Example 4 | 0.583 | 29.11 | 0.776 | 13.18 |
| Example 5 | 0.587 | 29.48 | 0.772 | 13.35 |
| Average value of Examples 4-5 | 0.585 | 29.3 | 0.774 | 13.27 |
| Standard deviation of Examples 4-5 | 0.003 | 0.26 | 0.003 | 0.12 |

In Table 1, $V_{oc}$ represents the open circuit current, $J_{sc}$ represents the short circuit current, F.F represents the fill-factor, and Rs represents series resistance.

Figure 6:
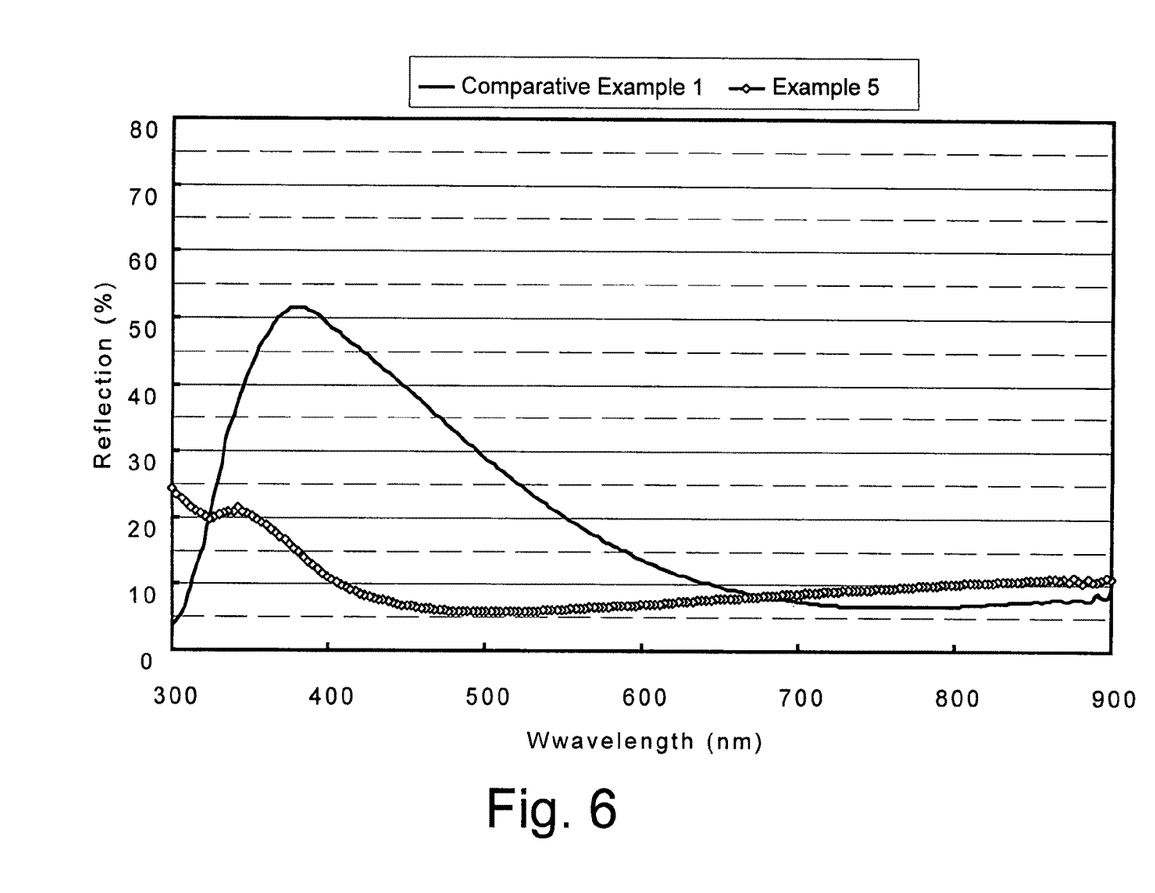
FIG. 6 shows a graph of the reflection obtained versus the wavelength of the incident light, where the reflection is obtained by irradiating the solar cell in Example 5 (performed with the atmospheric pressure plasma jet surface treatment) and the solar cell in Comparative Example 1 (not performed with the atmospheric pressure plasma jet surface treatment) with incident light of different wavelengths.

FIG. 6 shows a graph of the reflection obtained versus the wavelength of the incident light, where the reflection is obtained by irradiating the solar cell in Example 5 (the surface performed with the AAPJ treatment) and the solar cell in Comparative Example 1 (the surface not performed with the AAPJ treatment) with incident light of different wavelengths. As shown in FIG. 6, comparing to the traditional multicrystalline silicon solar cell, the multicrystalline silicon solar cells obtained from the foregoing fabrications have low reflectivity, and the average reflectivity thereof within large range of wavelength (400-900 nm) is controlled to be under 10%. Thus, the solar cell of the invention has superior light absorption effect.

EXAMPLE 6

A solution of HF:$HNO_3$:$H_2O$ with a volume ratio of 2:7:1 is adopted to etch a silicon substrate for about 3 min at about 10° C. so as to perform an SDR. A surface of the silicon substrate is processed with a dry etching treatment, such as a laser treatment, to have an irregular surface. The parameters in the laser treatment are presented below:
  Laser: Nd-YAG laser
  Laser wavelength: 1064 μm
  Laser power: 13 W
  Laser processing dot pitch: 400 μm
  Laser processing time for each dot: 0.5 msec The silicon substrate is placed into a solution of 0.1 M $Na_2S_2O_8$ and 0.1 M $AgNO_3$ with a volume ratio of 2:1 at room temperature under mild agitation to carry out the metal-activated selective oxidation step. Here, the steps of the entire metal-activated selective oxidation are completed in about 5-10 min. The silicon substrate is then rinsed with deionized water and dried in $N_2$ flow.

The silicon substrate after the selective oxidation is placed into the aqueous solution containing HF and $H_2O_2$ (the volume ratio of HF:$H_2O_2$:$H_2O$ is 1:5:10), etched for about 5-10 min at room temperature, and then rinsed with deionized water and dried in the $N_2$ flow.

The silicon substrate is dipped in a KOH:$H_2O$ solution with a volume ratio of 1:50 for removing the nano-porous Si layer formed. The concentrated $HNO_3$ solution may be optionally used to remove the silver remained, and the silicon substrate is then rinsed with deionized water.

Figure 7:
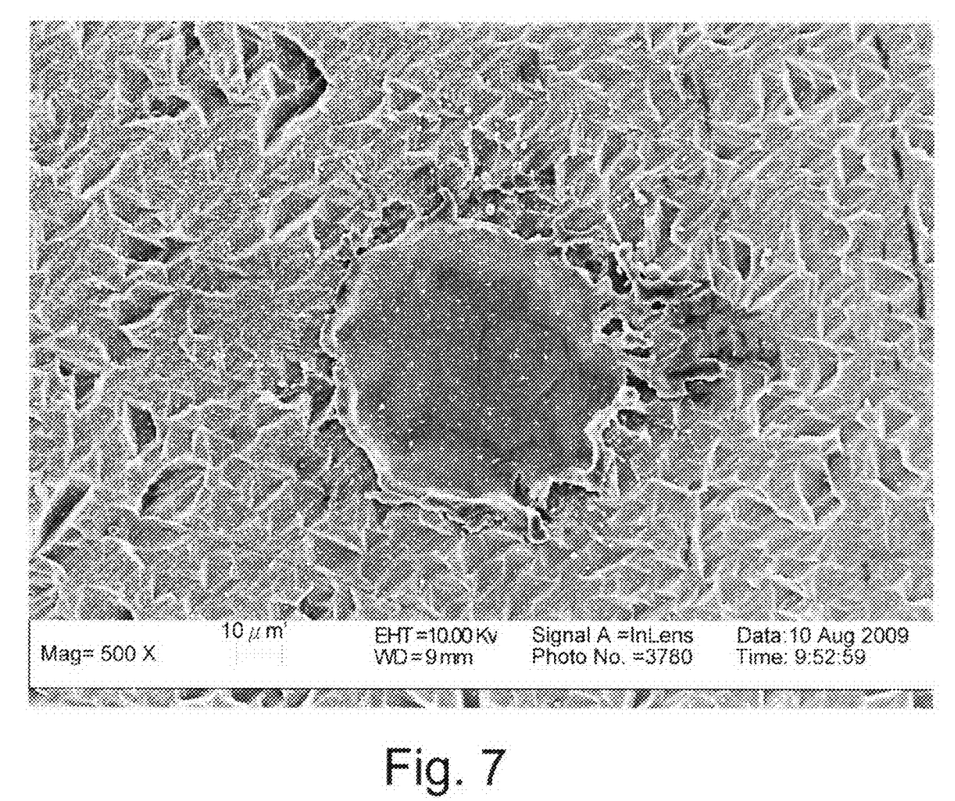
FIG. 7 is an SEM photo of a surface of a silicon substrate in Example 6.

FIG. 7 is an SEM photo of a surface of the silicon substrate in Example 6. As shown in FIG. 7, the laser treatment damages the surface of the silicon layer, thereby facilitating the proceeding of the metal-activated selective oxidation and the wet etching process.

In summary, the method of fabricating the solar cell in the invention includes performing the dry surface treatment on the silicon substrate in cooperation with the metal-activated selective oxidation and the wet etching process, such that the silicon substrate has a surface structure with low reflectivity. Here, the dry surface treatment facilitates the proceeding of the metal-activated selective oxidation and the wet etching process, thereby enhancing the fabrication efficiency of the solar cell, so that the solar cell has a nanotexturized surface. In other words, the method of fabricating the solar cell of the invention includes steps that are simple and easily operable. Accordingly, the solar cell has low reflectivity and is capable of attaining higher light absorption efficiency and better performance. Furthermore, the method of fabricating the solar cell of the invention improves the high reflectivity of the traditional multicrystalline silicon solar cell, thereby leading to the fabrication of a multicrystalline silicon solar cell that has low reflectivity and high efficiency.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a solar cell, the method comprising:
  performing a saw damage removal process on a silicon substrate;
  performing a dry surface treatment on a surface of the silicon substrate to form an irregular surface;
  performing a metal-activated selective oxidation on the irregular surface by using an aqueous solution containing an oxidant and a metal salt, wherein the aqueous solution comprises sodium persulfate and silver nitrate, and a molar ratio of the sodium persulfate to the silver nitrate in the aqueous solution is from 2:1 to 150:1;
  etching the irregular surface using an aqueous solution to form a nanotexturized surface of the silicon substrate;
  performing a dopant diffusion process on the silicon substrate to form a P-N junction in the silicon substrate;
  forming an anti-reflection layer on the silicon substrate; and
  forming an electrode on the silicon substrate.

2. The method of fabricating the solar cell as claimed in claim 1, wherein the dry surface treatment comprises an atmospheric pressure plasma jet (AAPJ) treatment or a laser treatment.

3. The method of fabricating the solar cell as claimed in claim 2, wherein the AAPJ treatment uses nitrogen or clean dry air.

4. The method of fabricating the solar cell as claimed in claim 2, wherein a radio frequency power of the AAPJ treatment ranges from 250-800 W.

5. The method of fabricating the solar cell as claimed in claim 2, wherein a processing rate of the AAPJ treatment ranges from 20-200 mm/s.

6. The method of fabricating the solar cell as claimed in claim 2, wherein a width of a plasma beam in the AAPJ treatment ranges from 2-4 mm.

7. The method of fabricating the solar cell as claimed in claim 2, wherein a processing time of the AAPJ treatment ranges from 20-240 s.

8. The method of fabricating the solar cell as claimed in claim 2, wherein a distance between the plasma beam in the AAPJ treatment and the silicon substrate ranges from 5-30 mm.

9. The method of fabricating the solar cell as claimed in claim 2, wherein an Nd-TAG laser is adopted in the laser treatment.

10. The method of fabricating the solar cell as claimed in claim 2, wherein a laser power of the laser treatment ranges from 1-20 W.

11. The method of fabricating the solar cell as claimed in claim 2, wherein a processing time of the laser treatment ranges from 0.1-1 ms.

12. The method of fabricating the solar cell as claimed in claim 2, wherein a laser processing dot pitch of the laser treatment ranges from 100-1000 μm.

13. The method of fabricating the solar cell as claimed in claim 1, wherein the saw damage removal process comprises using a solution containing hydrofluoric acid, nitric acid, and hydrogen peroxide.

14. The method of fabricating the solar cell as claimed in claim 1, wherein the oxidant comprises persulfate ion, permanganate ion, bichromate ion, or a mixture thereof.

15. The method of fabricating the solar cell as claimed in claim 1, wherein a duration time of the metal-activated selective oxidation ranges from 5-10 min.

16. The method of fabricating the solar cell as claimed in claim 1, wherein after forming the nanotexturized surface and before performing the dopant diffusion process, the method further comprises rinsing the silicon substrate with a nitric acid solution.

17. The method of fabricating the solar cell as claimed in claim 1, wherein the aqueous solution for etching the irregular surface contains hydrofluoric acid and hydrogen peroxide.

18. The method of fabricating the solar cell as claimed in claim 17, wherein a molar ratio of hydrofluoric acid to hydrogen peroxide to water in the aqueous solution used for etching the irregular surface is 1:1:10 to 3:1:30.

19. The method of fabricating the solar cell as claimed in claim 1, wherein a duration time for etching the irregular surface ranges from 5-10 min.

20. The method of fabricating the solar cell as claimed in claim 1, wherein after forming the nanotexturized surface and before performing the dopant diffusion process, the method further comprises rinsing the silicon substrate with a solution containing potassium hydroxide.

21. The method of fabricating the solar cell as claimed in claim 1, wherein the dopant comprises phosphorus oxychloride.

22. The method of fabricating the solar cell as claimed in claim 1, wherein a method of forming the anti-reflection layer comprises a physical vapor deposition (PVD) process.

23. The method of fabricating the solar cell as claimed in claim 1, wherein a method of forming the electrode comprises a screen printing process and a sintering process.

* * * * *